United States Patent [19]

Okamoto et al.

[11] Patent Number: 5,379,262
[45] Date of Patent: Jan. 3, 1995

[54] NONVOLATILE SEMICONDUCTOR MEMORY DEVICE

[75] Inventors: Yutaka Okamoto, Kawasaki; Yoshiyuki Tanaka, Tokyo, both of Japan

[73] Assignee: Kabushiki Kaisha Toshiba, Kawasaki, Japan

[21] Appl. No.: 84,477

[22] Filed: Jul. 1, 1993

[30] Foreign Application Priority Data

Jul. 1, 1992 [JP] Japan .................................. 4-174232

[51] Int. Cl.⁶ .................. G11C 11/40; G11C 13/00
[52] U.S. Cl. .............................. 365/230.01; 365/200; 365/230.03
[58] Field of Search ............... 365/230.01, 200, 230.03

[56] References Cited

U.S. PATENT DOCUMENTS 5,278,794  1/1994  Tanaka et al. ....................... 365/200

FOREIGN PATENT DOCUMENTS 2-292798  12/1990  Japan .
3-167644  7/1991  Japan .

Primary Examiner—Terrell W. Fears
Attorney, Agent, or Firm—Oblon, Spivak, McClelland, Maier, & Neustadt

[57] ABSTRACT

A nonvolatile semiconductor memory device including a memory means having a plurality of storage areas divided in a capacity serving as a management unit, a first managing means for, when data is to be written in the storage areas, circularly arranging the plurality of storage areas such that the plurality of storage areas physically or logically arranged, and managing the storage areas such that the plurality of storage areas are used in accordance with an order of an arrangement of the plurality of storage areas, a second managing means for managing whether data recorded in the plurality of storage areas is changed after a predetermined timing, and a control means for, when data is written in the storage area and a predetermined condition is satisfied, selecting a storage area having data which is not changed after a timing when the second managing means is initialized, moving the data in the selected storage area to another storage area, and initializing the second managing means when data in all the storage areas are assumed to be changed.

12 Claims, 16 Drawing Sheets

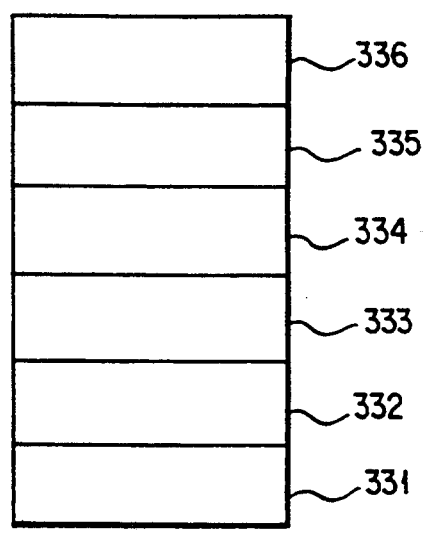
F I G. 6
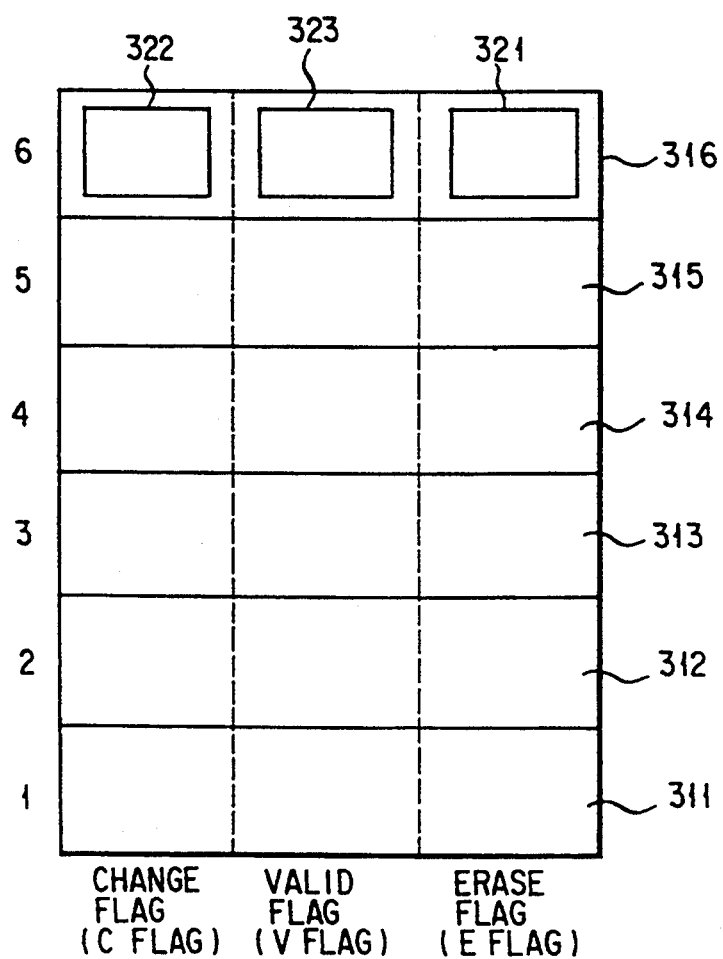
F I G. 7

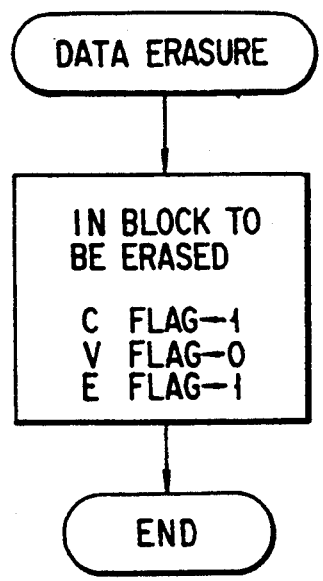
F I G. 9
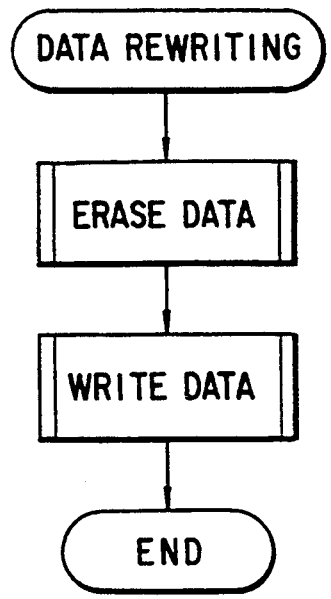
F I G. 10
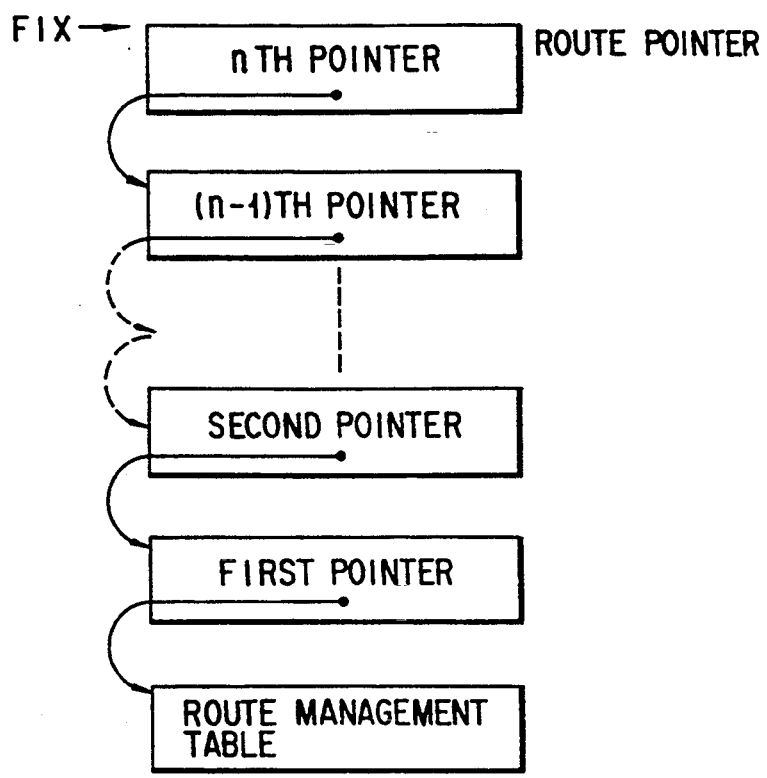
F I G. 14

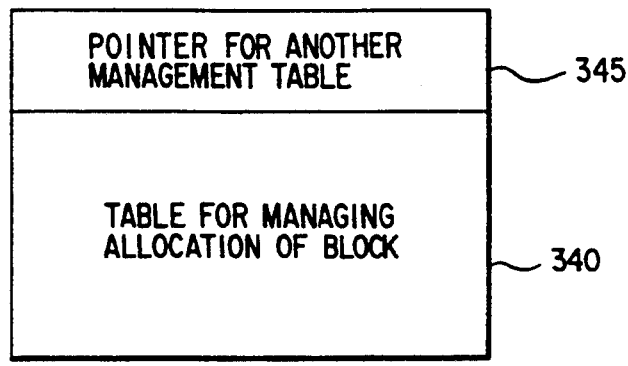
F I G. 15
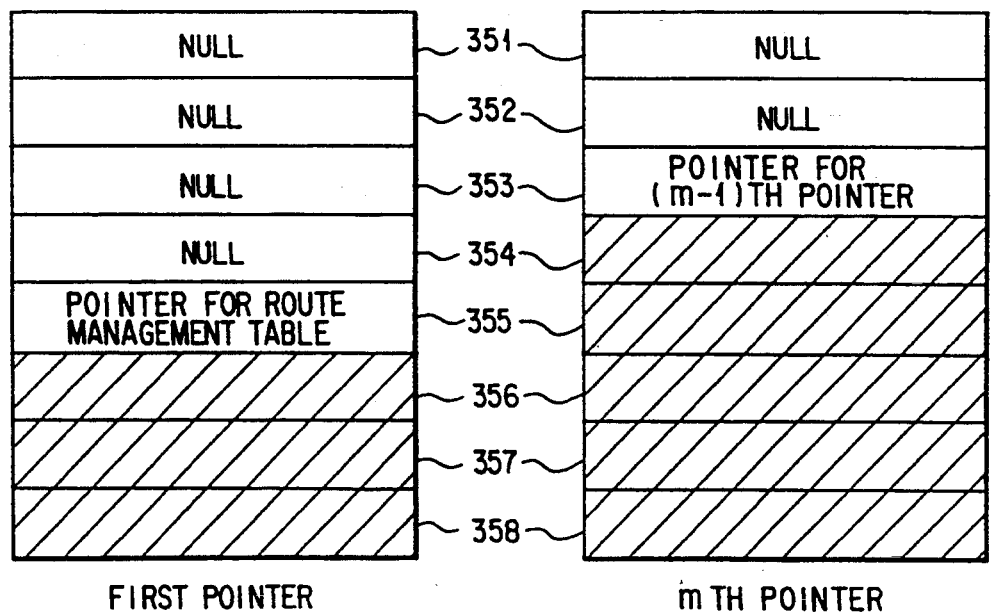
F I G. 16A    F I G. 16B

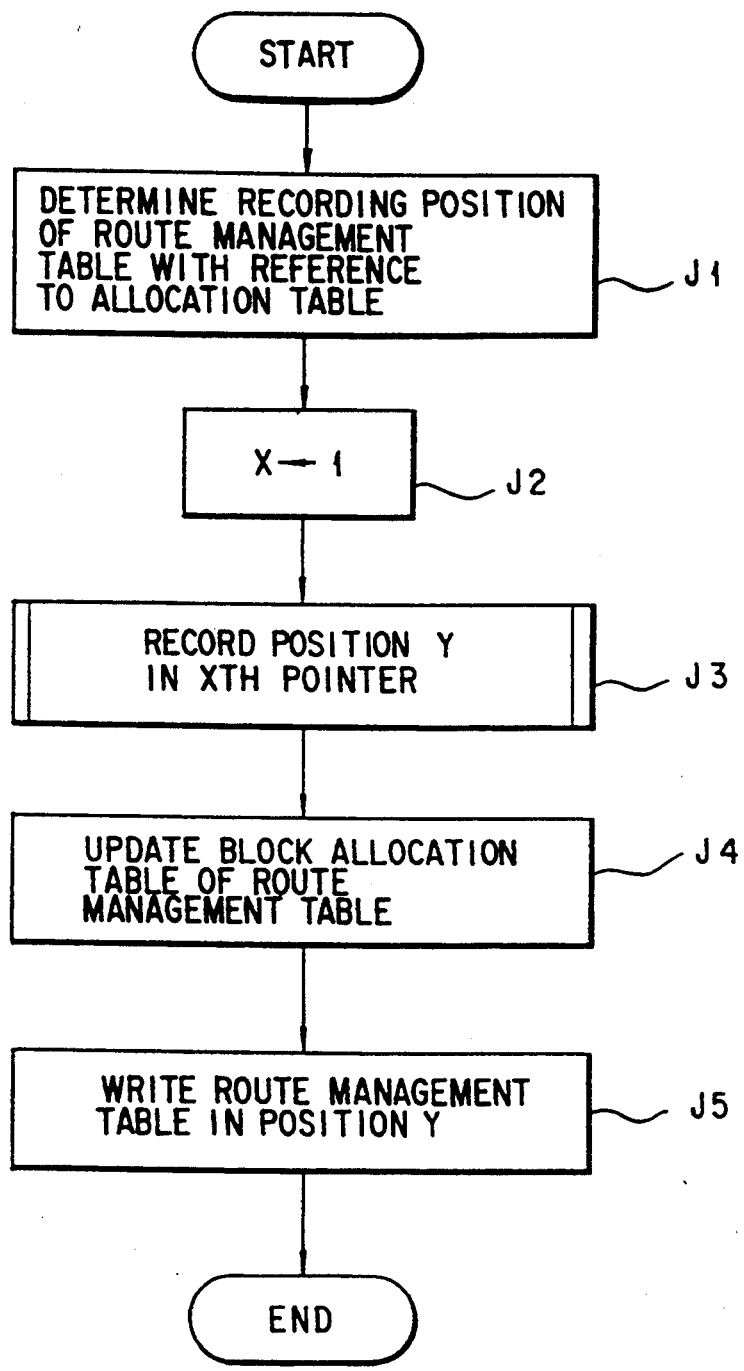
F I G. 17

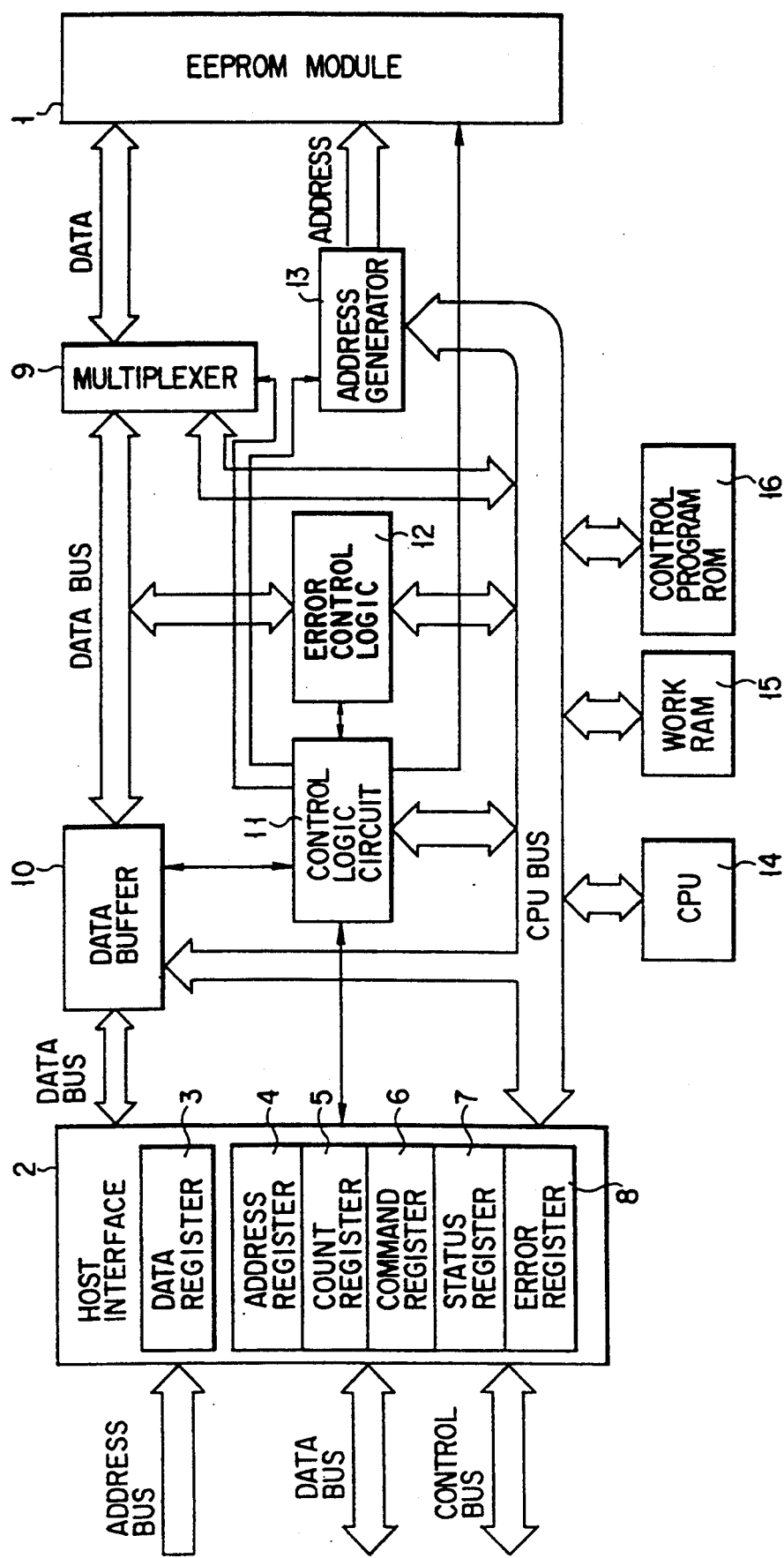
F I G. 19

NONVOLATILE SEMICONDUCTOR MEMORY DEVICE

BACKGROUND OF THE INVENTION

1. Field of the Invention

The present invention relates to a nonvolatile semiconductor memory device.

2. Description of the Related Art

At present, a magnetic disk device is popularly used as a secondary memory device for a computer. In recent years, an electrically erasable programmable nonvolatile semiconductor memory (to be referred to as an "EEPROM" hereinafter) has been used in place of a magnetic disk device because the EEPROM has characteristic features such as high reliability to mechanical strength, low power consumption, portability, and a high-speed access operation. However, the magnetic disk device is different from the EEPROM in function. For this reason, control for eliminating the difference must be performed to replace the conventional magnetic disk device with the EEPROM.

As one type of EEPROM, a NAND-type EEPROM which can be integrated at a high integration density is known. The NAND-type EEPROM is constituted as follows. That is, as shown in FIG. 1, one unit is formed by series-connecting a plurality of memory cells $M_1$ to $M_8$ in which the source and drain of adjacent memory cells are commonly used, and one terminal of the unit is connected to a bit line (not shown). One memory cell generally has an FETMOS structure obtained by stacking a charge accumulation layer and a control gate. The memory cell array is integrated in a p-type well formed in a p-type substrate or an n-type substrate. The drain side of each of the memory cells is connected to the bit line through a selection gate $S_1$, and the source side of each of the memory cells is connected to a source line (reference potential line) through a selection gate $S_2$. Control gates $CG_1$ to $CG_8$ of the memory cells $M_1$ to $M_8$ are continuously connected to each other in a row direction to form a word line. A set of the memory cells connected to the same word line is referred to as a page, and a set of pages interposed between a set of drain- and source-side selection gates is referred to as a NAND-type block or, simply, a block. A circuit arrangement of a block is shown in FIG. 2. One block is normally used as one unit which can be independently erased.

The operation of the NAND-type EEPROM is as follows. Data of all the memory cells in a NAND-type block are simultaneously erased. The voltages of all the control gates $CG_1$ to $CG_8$ of the selected NAND-type block are set to be a reference potential $V_{SS}$, and a high voltage $V_{PP}$ (e.g., 20 V) is applied to a p-type well and an n-type substrate. In this manner, electrons are discharged from the floating gates of all the memory cells to the substrate, and the threshold value of each memory cell is shifted in a negative direction. This state is normally defined as a "1" state. Chip erasure is performed by setting all the NAND-type blocks in a selection state.

An operation of writing data is sequentially performed from the memory cell $M_8$ located at a position farthest from the bit line. A high voltage $V_{PP}$ (e.g., 20 V) is applied to a selected control gate in a NAND-type block, and an intermediate potential $V_M$ (e.g., 10 V) is applied to a non-selected gate. The voltage of $V_{SS}$ or $V_M$ is applied to the bit line BL in accordance with data. When the voltage $V_{SS}$ is applied to the bit line BL, ("0" is written), the potential $V_{SS}$ is transmitted to the selected memory, electrons are injected in the floating gate of the selected memory, and the threshold value of the selected memory is shifted in a positive direction. This state is normally defined as a "0" state. When the voltage $V_M$ is applied to the bit line ("1" is written), electron injection does not occur in the memory cell, and the threshold value is maintained at a constant negative valve. An operation of reading data is performed as follows. That is, the control gate voltage of a selected memory cell in a NAND-type block is set to be $V_{SS}$, and the control and selection gates of the memory cells other than the selected memory cell are set to be $V_{CC}$, thereby detecting whether a current flows in the selected memory cell.

In the NAND-type EEPROM, a data writing operation must be sequentially performed from a page near the source line to a page on the drain side. This necessity will be described below with reference to FIGS. 3A and 3B.

When "1" is written, the intermediate potential $V_M$ (about 10 V) is transferred to the drain of the selected memory cell, and an erasure state (i.e., a negative threshold value) is maintained without performing any electron injection. FIGS. 3A and 3B show a state wherein a control gate 1 is set in a selection state ($V_{PP}$). The control gate 2 is not selected, and the voltage $V_M$ is applied to the control gate 2. The voltage $V_M$ ("1" is written) is also applied the drains. FIG. 3A shows the case wherein write access is performed from the source side, and FIG. 3B shows the case wherein write access is performed from the drain side.

In the case of FIG. 3A, the voltage $V_M$ is reliably transferred to a source-side cell Ma1 because the threshold value of a drain-side cell Ma2 is negative. In the case of FIG. 3B, if "0" is written in a drain-side cell Mb2 in advance, and the drain-side cell Mb2 has a positive threshold value (e.g., 3.5 V), only a voltage obtained by subtracting the threshold value of the cell Mb2 from the voltage $V_M$ is transferred to the cell Mb1 when "1" is to be written in the source-side cell Mb1. For this reason, a potential difference between the control gate and the substrate is increased in the cell Mb1, and write access may be erroneously performed. As described above, means for sequentially performing write access from the source side is important to prevent erroneous write access.

In a conventional magnetic disk device, accesses such as read or write access of data is performed using a sector as a unit. Each storage area formed concentrically formed on a magnetic recording medium is called a track. The track is divided into several areas to form storage units called sectors. The capacity of one sector of a typical magnetic disk device used in a portable computer for personal use is 512 bytes.

When the computer causes the magnetic disk device to store data, a mass of data is called a file. A function of managing positions at which the file is stored is a critical function of an operation system (to be referred to as an "OS" hereinafter).

FIG. 4 is a view showing the manner in which the MS-DOS as a typical OS used in a portable computer for personal use uses the storage areas of a magnetic disk device to manage files. A boot area 61 is an area in which data required for starting the operation of the computer is stored, and the boot area 61 is not related to management of user files. File names and a management table for recording data related to the file names are stored in a root directory area 64. Although sub-directories are managed in the same manner as that of the root directory, the sub-directories each having the same content as that of the root directory can be hierarchically present in a data area. These subdirectories are simply called directories because each of the sub-directories has the same function as that of the directory, although the sub-directories are different from the directories in areas and levels in hierarchy. Data related to one file in a directory occupies a 32-byte area, and the content of the data is shown in FIG. 5.

Data recording of the magnetic disk device is performed using a sector as a unit as described above. When an area on the disk is to be allocated to a file, a logical unit called a cluster is used. One cluster is determined depending on the types of disks such that one cluster is constituted by sectors, the number of which is a power of 2. A start cluster number 66 in FIG. 5 is the number of a cluster allocated to the start address of a file. File allocation data for the data area is stored in a FAT area 62 in FIG. 4. The file allocation data represents the manner in which the clusters are connected to constitute one file in a data area 65. Backup data 63 obtained by copying the FAT area 62 is written in the management table. As described above, the MS-DOS file management is performed on the basis of data in the FAT area and the root directory area. The positions and sizes of these areas are fixedly determined depending on the types of disks.

An access unit of a NAND-type EEPROM is one page as described above. When a 4-Mbit NAND-type EEPROM is used as an example, 1 page is constituted by 512 bytes, and 1 block is constituted by 8 pages. In an application in which a magnetic disk device is replaced with a NAND-type EEPROM, when one sector of the disk corresponds to one page of the NAND-type EEPROM, the disk device can easily be converted into the NAND-type EEPROM. As a significant difference between the magnetic disk device and the EEPROM posed when the magnetic disk device is to be replaced with the EEPROM, a difference between their rewrite counts of data is known. In the magnetic disk device, a rewrite count of data recorded on a recording medium is not limited, and the service life of the magnetic disk device is controlled under mechanical factors such as a damage caused by bringing a head into contact with the magnetic recording medium. On the other hand, in the EEPROM, a rewrite count of data is about $10^4$ to $10^5$ at most in the existing technique.

As described above, a "data" amount recorded in one sector of the magnetic disk device is 512 bytes, and this data amount is an amount of data recorded/reproduced by a user. Data required for recording/reproducing control are additionally written in the sector. As one type of such data, an error correction code (to be referred to as an ECC code hereinafter) is known. When user data is not correctly read due to a defective recording medium or influence of noise, the ECC code is used for detecting an error in the readout data and correcting the error. When data is to be written in a sector, the ECC code is calculated by an ECC generator on the basis of the data to be recorded so as to be written on a recording medium together with the data.

An access unit of the NAND-type EEPROM is one page, and one page corresponds to a sector of the magnetic disk device although a page is slightly different from a sector. In order to improve reliability, as in the magnetic disk device, a 1-page physical capacity is set to be larger than an amount of data recorded/reproduced by a user, and the redundancy is assigned to the ECC code. This is an effective scheme.

In a conventional magnetic disk device, initialization called "format" must be performed to use the magnetic disk device as a memory device. A track in which a series of sectors is arranged on the circumference of a magnetic recording medium is formed on the magnetic recording medium, and a plurality (normally, several hundreds or several thousands) of tracks are concentrically formed. At this time, a specific initialization pattern is written in a user data area of each sector, and data required for recording/reproducing control is written. An ECC calculated by the initialization pattern is written. On the other hand, as is apparent from the above description, an overwriting operation performed in the magnetic disk device cannot be performed to a page in which data is written in the NAND-type EEPROM. In order to rewrite data of even one page, an erasure operation must be performed using a block constituted by a plurality of pages. For this reason, the data of pages other than the page to be erased must be saved as needed, and the data must be written again after the erasure operation. Therefore, the pages whose data are erased are often preferably set in an erasure state until effective user data is written in the pages.

In the magnetic disk device, assuming that the guaranteed service life of the magnetic disk device is set to be 20,000 operating hours, and hours in a fraction of the service life are spent for rewriting data, it is estimated that rewrite operations can be performed in a file management area about $10^9$ times at least. In contrast to this, in the NAND-type EEPROM, the maximum rewrite count is about $10^5$, as described above. When the NAND-type EEPROM is used like a magnetic disk device in a worst case wherein writing operations are concentrated on one block, writing operations can be performed at most 1/10,000 times of that of the magnetic disk device. An apparent rewrite count is larger than the above rewrite count because positions at which actual data are written are distributed in the storage areas. However, if there is data which is not erased for a long time after the data is written, this phenomenon is equivalent to a decrease in writable area. For this reason, the rewrite count is decreased accordingly.

As in file management performed by an OS, a file may be generally recorded in any empty area of a data area, and the empty area is managed by a directory and a management table such as a FAT. This file management is applied to an EEPROM having a limited maximum rewrite count, and positions in which files are to be written can be easily distributed to prevent a rewriting operation from being concentrated on the same position. However, when a file is written or rewritten, the content of a file management table must be rewritten, and the frequency of rewriting of these table data is considerably higher than that of writing of data files. Furthermore, the content of the management table must always be recorded on a fixed position. Therefore, when an EEPROM is applied to a file memory device, a rewriting operation is concentrated on the area of the management table area, and the service life of the EEPROM may be shortened.

In the magnetic disk device, a check operation may be performed by an ECC in a sector in which effective user data is not written as in a sector in which the user data is written. In contrast to this, in the NAND-type EEPROM which is controlled such that an erased page is set in an erasure state until effective user data is written in the page, when a page in which the effective user data is not written is read out, the ECC examination circuit determines that an error has occurred because all data in the page including an ECC are set to be "1".

An operating system in a host computer does not normally read out only a page in which effective data is not written, but may load the page together with a page in which the effective data is written when a plurality of pages are used as a unit for file management. When a block is to be erased during an operation of rewriting a page, and a control unit in which means for controlling a saving operation of data cannot be known whether data is written in another page in the block to be erased is used, pages set in an erasure state must also be loaded in the buffer. In this case, when the ECC examination circuit is operated to the data in the pages set in an erasure state, although the pages are normal pages, the ECC examination circuit erroneously recognizes that an error has occurred, and error processing is started. As a result, the processing cannot be normally performed.

Prior art related to to present invention is disclosed in Published Unexamined Japanese Patent Application No. 2-292798 and Published Unexamined Japanese Patent Application No. 3-167644.

SUMMARY OF THE INVENTION

It is an object of the present invention to provide a nonvolatile semiconductor memory device capable of obtaining a service life equal to that of a magnetic disk device and assuring high reliability.

The first nonvolatile semiconductor memory device of the present invention includes memory means having a plurality of storage areas divided in a capacity serving as a management unit; first managing means for, when data is to be written in said storage areas, circularly arranging said plurality of storage areas such that said plurality of storage areas physically or logically arranged, and managing said storage areas such that said plurality of storage areas are used in accordance with an order of an arrangement of said plurality of storage areas; second managing means for managing whether data recorded in said plurality of storage areas is changed after a predetermined timing; and control means for, when data is written in said storage area and a predetermined condition is satisfied, selecting a storage area having data which is not changed after a second managing means has been initialized, moving the data in said selected storage area to another storage area, and initializing said second managing means when data in all the storage areas are predicated to be changed, and also control means which includes means for determining that the predetermined condition is satisfied when write access is performed to storage areas of one cycle in the arrangement in which said plurality of storage areas managed by said first managing means are circulated.

According to the first nonvolatile semiconductor memory device, since write access of data is circulated with respect to the plurality of storage areas in one direction, the write access is not concentrated on a specific storage area and is uniformly performed in all of the plurality of storage areas. After the write access is performed, data which has been stored in the same area without being changed for a long time is moved such that the write counts of all of the plurality of storage areas are equal to each other. For this reason, an apparent writing area is not narrowed, and the service life of the memory device is not shortened. Therefore, although a maximum rewrite count of the same area is limited, the memory device can have a service life equal to that of a magnetic disk, and the memory device can be used in a variety of applications. In addition, a storage area having written data which is not changed is selected by one circulation cycle of write access, so that the apparent writing area can be more properly prevented from being narrowed.

The second nonvolatile semiconductor memory device of the present invention includes a management table for managing a recording position of the file; memory means for recording the management table and pointers, in a plurality of levels, constituted to hierarchically represent a recording position of said management table; and control means for controlling to fix only the recording position of a pointer as a root of said pointers in the plurality of levels while the recording position of said management table is not fixed.

According to the second nonvolatile semiconductor memory device, a recording position in the memory means of the frequently rewritten management table is not fixed, and pointers representing the position of the management table are hierarchically recorded in a plurality of levels. For this reason, a write count of the pointer which must be recorded at a fixed position to retrieve the pointer can be suppressed to the same count as the rewrite count of any other area. Therefore, write access is not concentrated on a specific storage area, and the service life of the memory device can be extended.

The third nonvolatile semiconductor memory device of the present invention includes memory means having a memory area in which the data and an error detection code corresponding to the data are recorded; error detection means for detecting whether an error occurs in the data on the basis of the data and the error detection code which are read out from said memory means; erasure detection means for detecting whether said storage area in which the data is recorded is set in an erasure state on the basis of the data read out from said memory means; and control means for processing the readout data as data having no error even when an error is detected by said error detection means in the data read out from said memory means, when said erasure detection means simultaneously detects an erasure state.

According to the third nonvolatile semiconductor memory device, it is detected by readout data whether pages and the like serving as storage areas of the data are set in an erasure state, thereby preventing an erroneous detection result obtained from error detection means. Therefore, even when control is performed such that pages and the like set in an erasure state are read out without differentiating these pages from pages and the like in which data are written, correct error detection of the readout data is performed so as to assure high reliability.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 6 is a view showing the arrangement of storage areas of the EEPROM in the first embodiment;

FIG. 7 is a view showing a table arrangement for managing write access to a block in a nonvolatile semiconductor memory device according to the first embodiment of the present invention;

FIG. 9 is a flow chart showing a sequence of erasing data in the first embodiment;

FIG. 10 is a flow chart showing a sequence of rewriting data in the first embodiment;

FIG. 14 is a view showing a relationship between a pointer and a route management table in the second embodiment of the present invention;

FIG. 15 is a view showing the arrangement of the route management table in the second embodiment;

FIGS. 16A and 16B are views showing blocks in which pointers are recorded in the second embodiment;

FIG. 17 is a flow chart showing the sequence of processing performed upon updating a route management table in the second embodiment;

FIG. 19 is a block diagram showing the arrangement of a nonvolatile semiconductor memory device according to the third embodiment of the present invention;

DETAILED DESCRIPTION OF THE PREFERRED EMBODIMENTS

Figure 1:
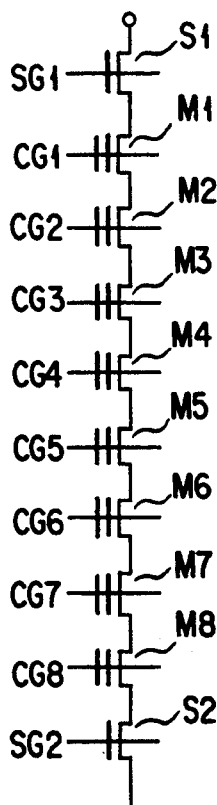
FIG. 1 is an equivalent circuit diagram showing one NAND cell of an EEPROM.
Figure 2:
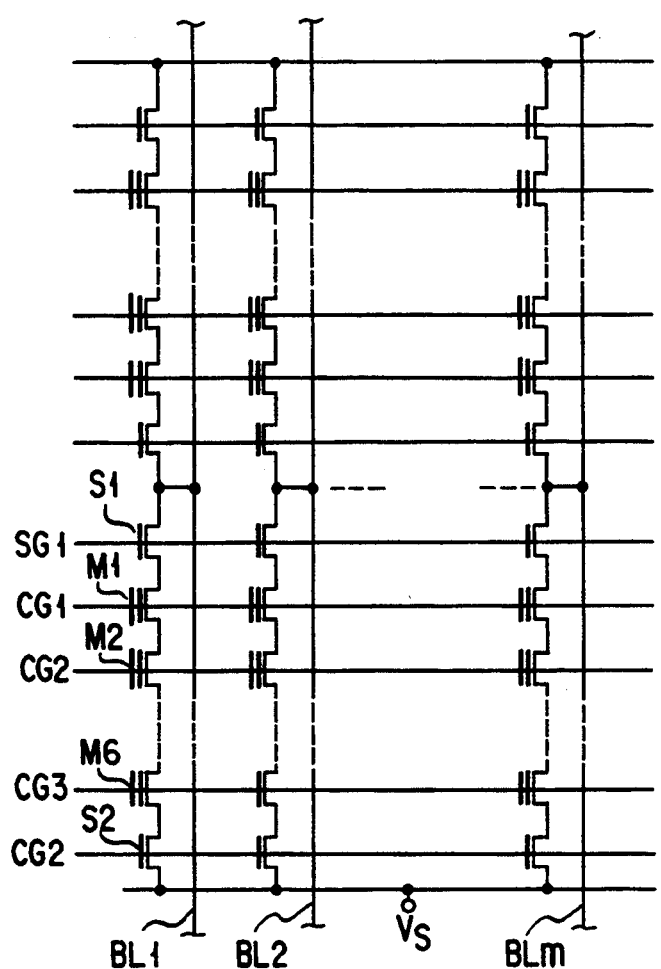
FIG. 2 is an equivalent circuit showing a memory cell array of an EEPROM.
Figure 3A:
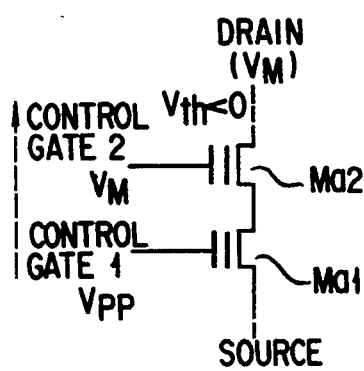
FIGS. 3A and 3B are views for explaining a write operation of a NAND-type EEPROM.
Figure 3B:
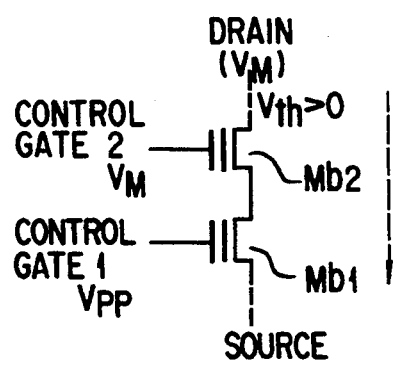
Figure 4:
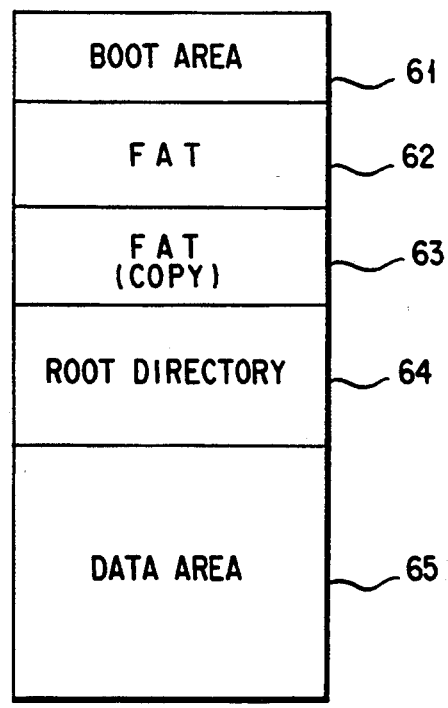
FIG. 4 is a view for explaining a method of managing files of the MS-DOS which is one of operating systems.
Figure 5:
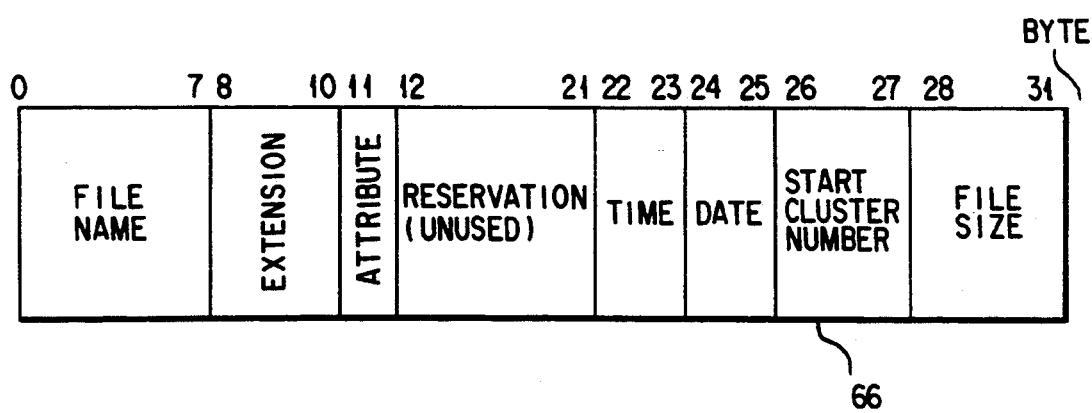
FIG. 5 is a view for explaining an arrangement of a directory.

A nonvolatile semiconductor memory device according to an embodiment of the present invention will be described below with reference to the accompanying drawings.

FIGS. 6 to 13F are views showing the first embodiment of the present invention.

FIG. 6 shows the arrangement of storage areas in an EEPROM serving as memory means. In FIG. 6, although the number of storage areas 331 to 336 divided in capacities serving as management units is the same as that of erasure units or is an integer multiple of the number of erasure units to easily handle the storage areas 331 to 336, the number of storage areas is not limited to this number. In the first embodiment, although the unit storage area is referred to as only a block hereinafter, the unit storage area may be regarded as a block serving as an erasure unit of a NAND-type EEPROM. The unit storage area is not limited to the erasure unit. Numbers given to blocks are used for ordering the blocks, although the numbers are conveniently given in a physical address order, the numbers may be given in a logical order in accordance with a specific rule. For descriptive convenience, it is assumed herein that memory means used in this description is constituted by 6 blocks.

FIG. 7 is a table for managing write access to the blocks 331 to 336. Each of items 311 to 316 representing the states of the block 331 to 336 is constituted by, as shown in FIG. 7, three flags 321 to 323. That is, the flag (to be referred to as an "erase flag" or "E flag" hereinafter) 321 serving as a first managing means for performing management such that write access of data to the blocks is circulated in one direction in accordance with an order of blocks with reference to the first managing means and a valid flag; the flag (to be referred to as a "change flag" or "C flag" hereinafter) 322 serving as a first managing means for managing whether data recorded in a block is changed or not after a certain time in the presence of data in the block; and the flag (to be referred to as a "valid flag" or "V flag") 323 serving as a third management means for managing whether significant data is recorded in a block.

A write scheme according to the first embodiment will be described below with reference to FIGS. 8A to 13F. In order to read out written data, means for managing correspondence between the tag (e.g., a file name) of the written data and a position in which the data is written is required. However, since a method performed in a normal file system (OS) can be applied as the write scheme, a description of the write scheme will be omitted in this embodiment.

Figure 8A:
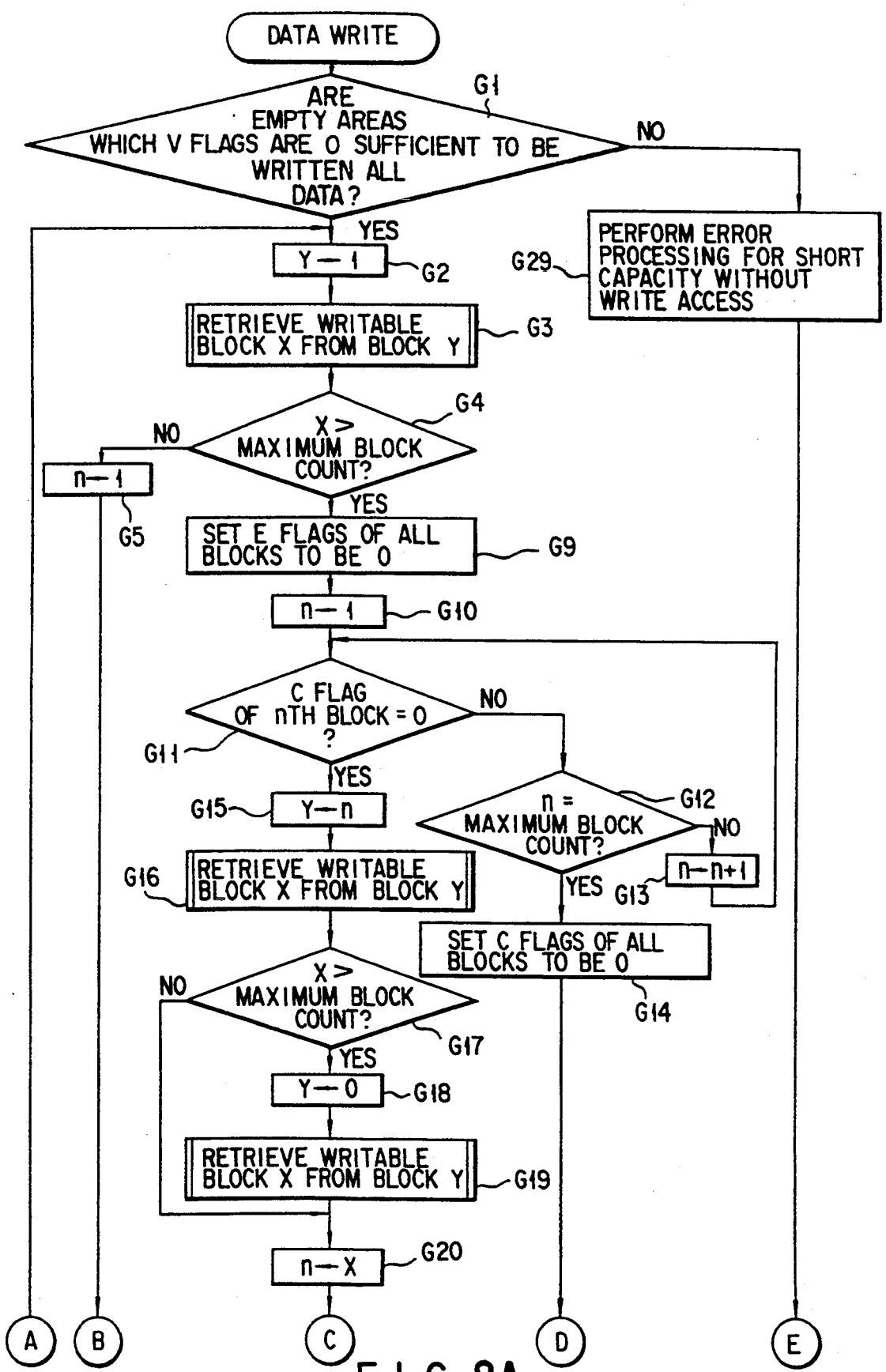
FIGS. 8A to 8B are flow charts showing a sequence of writing data in a storage area in the first embodiment.
Figure 8B:
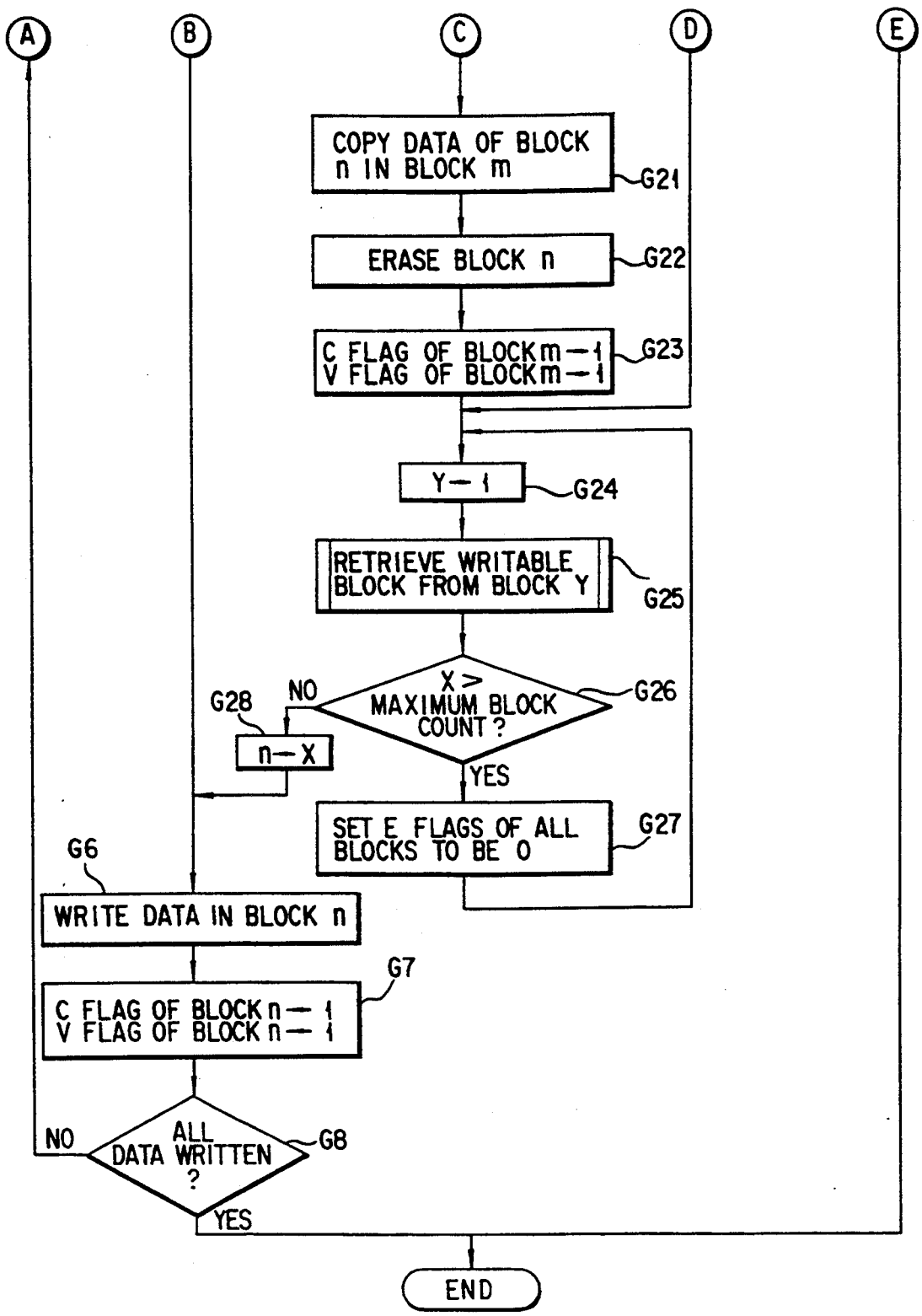
Figure 11:
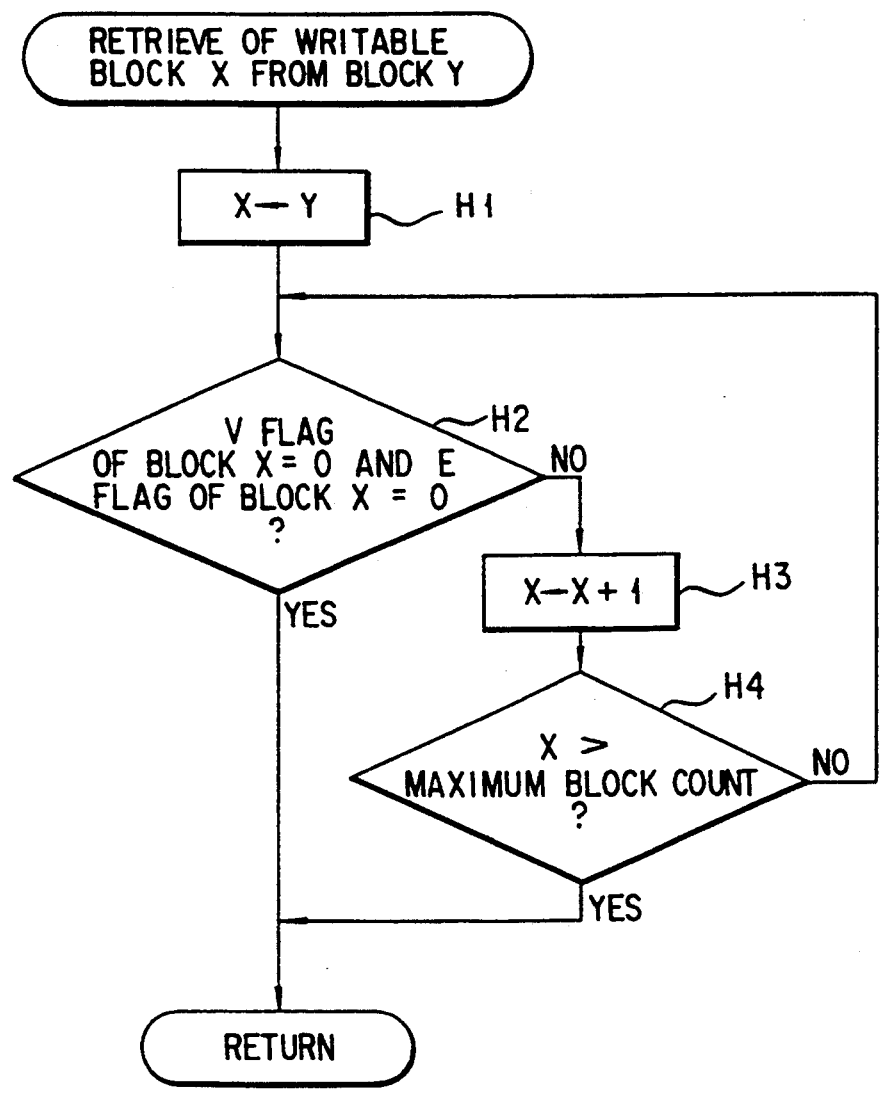
FIG. 11 is a flow chart showing a subroutine used in the sequence of writing the data in FIG. 8B.

FIGS. 8A and 8B are a flow chart showing a data write sequence, FIG. 9 is a flow chart showing a data erase sequence, and FIG. 10 is a flow chart showing a data rewrite sequence. FIGS. 12A to 12F and FIGS. 13A to 13F are views for simultaneously explaining changes in states of the storage areas shown in FIG. 6 and the table (FIG. 7) for managing the storage areas. The changes are caused by writing data. The blocks indicated by hatched lines and indicating the storage areas in FIGS. 12A to 12F and FIGS. 13A to 13F represent areas in which valid data are written.

Figure 12C:
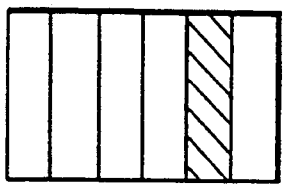
FIGS. 12A to 12F and 13A to 13F are views for explaining changes in states of storage areas and a table for managing the storage areas, which changes are caused by writing data.
Figure 12F:
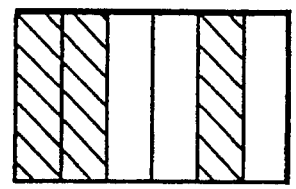
Figure 12B:
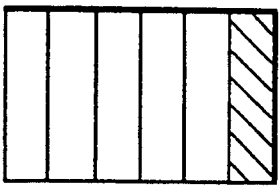
Figure 12E:
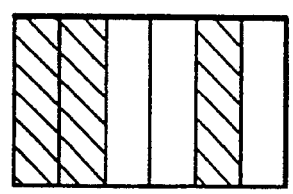
Figure 12A:
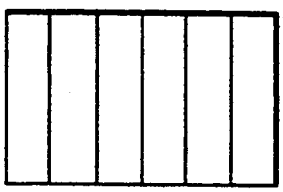

Before a memory device is used, as shown in FIG. 12A, it is assumed that all the flags are initialized to be "0". A case wherein write access to a block is performed in this state will be described below.

In step G1 in FIG. 8A, it is checked whether a necessary capacity is available. In the scheme according to the first embodiment, since write access is performed to only "0" blocks by a V flag for managing whether significant data is recorded and an E flag for managing circulation in one direction, a block matched with this condition is retrieved (steps G2 and G3 in FIG. 8A and steps H1 to H4 in FIG. 11). After it is confirmed that the block is matched with the condition, data is written in the first block (steps G4 to G6 in FIG. 8A), and a C flag and the V flag are set to be "1" (step G7 in FIG. 8A; FIG. 12B). When the currently written data is immediately rewritten, the V flag of the first flock is changed to "0", and the E flag is changed to "1" in accordance with the sequence in FIG. 9. The data is written in the second block retrieved in the same sequence as that of the first write access (FIG. 12C).

Although the first block is set in a logically erased state with the above operation, an electrical erasure operation of the first block must be additionally performed. The electric erasure operation is preferably performed on the background in consideration of processing speed. However, this method essentially departs from this embodiment, and a description thereof will be omitted. In the following description, it is assumed that electric erasure operations are performed on these blocks by a certain method before data are written in the blocks.

Figure 12D:
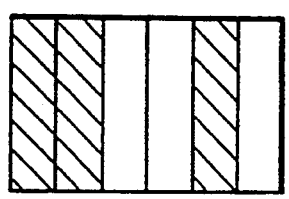

When the above write processing is continued, a state, e.g., the state shown in FIG. 12D, wherein data is uniformly written in the entire memory in an order of the block numbers is obtained. In this case, for example, when data of one block is to be written, retrieving in step G3 of FIG. 8A has failed although there is an empty area. A state wherein the retrieving has failed indicates that a uniform write cycle for the empty areas of the blocks is ended. Therefore, the E flags of all the blocks are cleared to be "0" to control the next write cycle in one direction (step G9 in FIG. 8A; FIG. 12E).

Figure 13A:
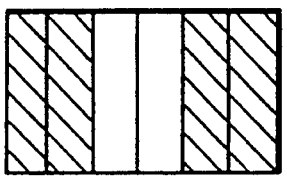

In addition to the uniform write access in one direction, the characteristic feature of the first embodiment is that data stored in the same position for a long time is moved. In order to achieve the characteristic feature, proper movement timings related to a write count are required. As one of the timings, a timing when all the E flags are cleared is used. In FIG. 8A, when the C flags are examined by the processing in steps G10 to G13 at this timing, data to be moved is selected. In FIG. 12E, all the C flags are set to be "1". This state indicates that all the blocks are rewritten at least once from the time when the C flags are initialized to the time when the C flags are set in the state of FIG. 12E. In this case, since data which occupies the same block for a time longer than that of any other data is not determined, initialization is performed again in step G14 (FIG. 12F). Thereafter, data is written in the a for starting the series of processing operations (steps G24 to G28 in FIG. 8B; G6; FIG. 13A).

Figure 13B:
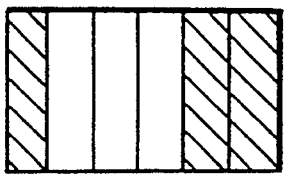
Figure 13C:
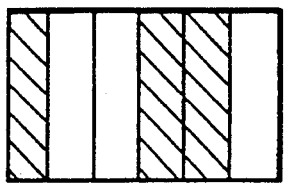
Figure 13D:
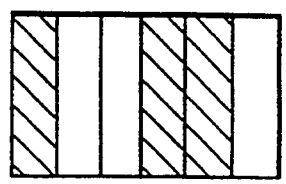
Figure 13E:
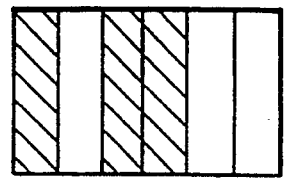
Figure 13F:
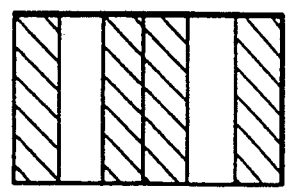

Assume that the data of the fifth block is erased to obtain the state in FIG. 13B, and that write access to the third block and an erasure operation of the first block are performed to obtain the state in FIG. 13C. In this state, a case wherein write access to the first block is performed as the final write pattern at this timing will be considered as follows. Since one rewrite cycle is ended, retrieving of a writable area has failed, all the E flags are cleared (FIG. 13D). Although the C flags are examined, since the C flag of the second block is set to be "0", the data of this block is determined as data which is not rewritten for a relatively long time, and the data is to be moved. In accordance with the sequence in steps G15 to G20 in FIG. 8A, a destination write block for the data is circulated and retrieved in a direction of performing write access using a start point as the block in which the data to be moved is stored. In this example, the fourth block corresponds to the destination block. After the data of the second block is copied to the fourth block, the data of the second block is erased (steps G21 to G23 in FIG. 8B; FIG. 13E). In this manner, the data which has occupied the second block from the timing of FIG. 12C is moved, and the second block is set in a rewritable state.

As a sequential operation, data of one block required at the timing of FIG. 13C is written in an empty block. However, when a writable block is retrieved by the same method as that of normal write access, the retrieving may fail a case wherein there is only one empty block at the timing of FIG. 13C. At this time, data to be moved is set in the empty block, and the E flag of a block in which the data to be moved is originally set is set to be "1". For this reason, the block is not retrieved. Therefore, as described in step G27 of FIG. 8B, all the E flags must be cleared. When the E flag of the block in which the data to be moved is originally set is maintained at "0", the block can be retrieved. Although there is another empty block, the block immediately after the data is moved is retrieved as a rewritable block, and an electrical erasure operation of the background may not be performed on time.

The second embodiment of the present invention is shown in FIGS. 14 to 18.

In the second embodiment, it is assumed that a 4-Mbit NAND-type EEPROM is used as a nonvolatile semiconductor memory. In order to briefly describe the main point of the second embodiment, a logical management unit of a storage area corresponding to an MS-DOS cluster coincides with a block serving as an erasure unit of the NAND-type EEPROM. In this embodiment, a user file, a table for managing a recording position of the file, and a pointer, of hierarchical pointers to the table, which does not have a fixed position are not required to be recorded in a specific area of the storage area, so that the file, the table, and the pointer must be controlled such that write access is distributed in the entire storage area as widely as possible. However, this embodiment aims at describing a method in which a table for managing the position of a file need not be fixed in the specific area of the storage area. Therefore, although it is assumed that distribution write control is performed, a description thereof will be omitted.

FIG. 15 shows a block constituting one table for managing a position at which a file is recorded. In FIG. 15, the table is referred to as a route management table. In FIG. 15, in a table 340, having the same arrangement of a FAT of MS-DOS, for managing a block allocation state of the entire storage area, according to this embodiment, not only a block in which a user file is recorded but a block in which management data such as the file management table itself and the pointer of the file management table are recorded are moved. For this reason, the allocation of these blocks is managed. The pointer 345 in FIG. 15 is assumed to be a pointer representing the position of an additional block used when block allocation data cannot be stored in this block, and the positions of a file name corresponding to a directory of MS-DOS, a management table related to data added to the file name, or the like. That is, when the management table shown in FIG. 15 can be accessed, all of the data related to file management can be accessed.

FIGS. 16A and 16B show blocks in which pointers are arranged such that positions of the recorded data are hierarchically represented to indicate the positions at which the route management table is recorded.

Pages 351 to 358 in FIG. 16A represent the pages of a NAND-type EEPROM, the page 358 represents a page on a source side, and the page 351 represents a page on a drain side. Each of the pointers has a data amount within one page, and write access is sequentially performed from the pointer on the source side in accordance with a write rule of the NAND-type EEPROM. Each of the pages 356 to 358 indicated by hatched lines and shown in FIG. 16A indicates that an updated pointer is written, and "NULL" in each of the pages 351 to 354 indicates that data is set in an erased state. In the block in which the first pointer in FIG. 16A is stored, the data in page 355 represents the position of the route management table.

The block in which the m-th pointer in FIG. 16B is stored represents the position of the (m−1)th pointer with the same arrangement as that of FIG. 16A. When the number of pointers (the number of hierarchical levels) is set to be n, the first to (n−1)th pointers may be recorded on any position of a recordable area, and these pointers are accessed by sequentially retracing the pointers of a plurality of levels. Only the n-th pointer (to be referred to a route pointer) is recorded at a fixed position of the storage area. FIG. 14 shows relationships between the pointers fixed in the plurality of levels.

FIG. 17 is a flow chart showing the sequence of processing performed in accordance with a change in route management table required in a file management scheme according to the second embodiment. The content of the route management table is loaded on a RAM in advance to be developed. After the route management table is updated in the RAM, the route management table is written again.

Figure 18:
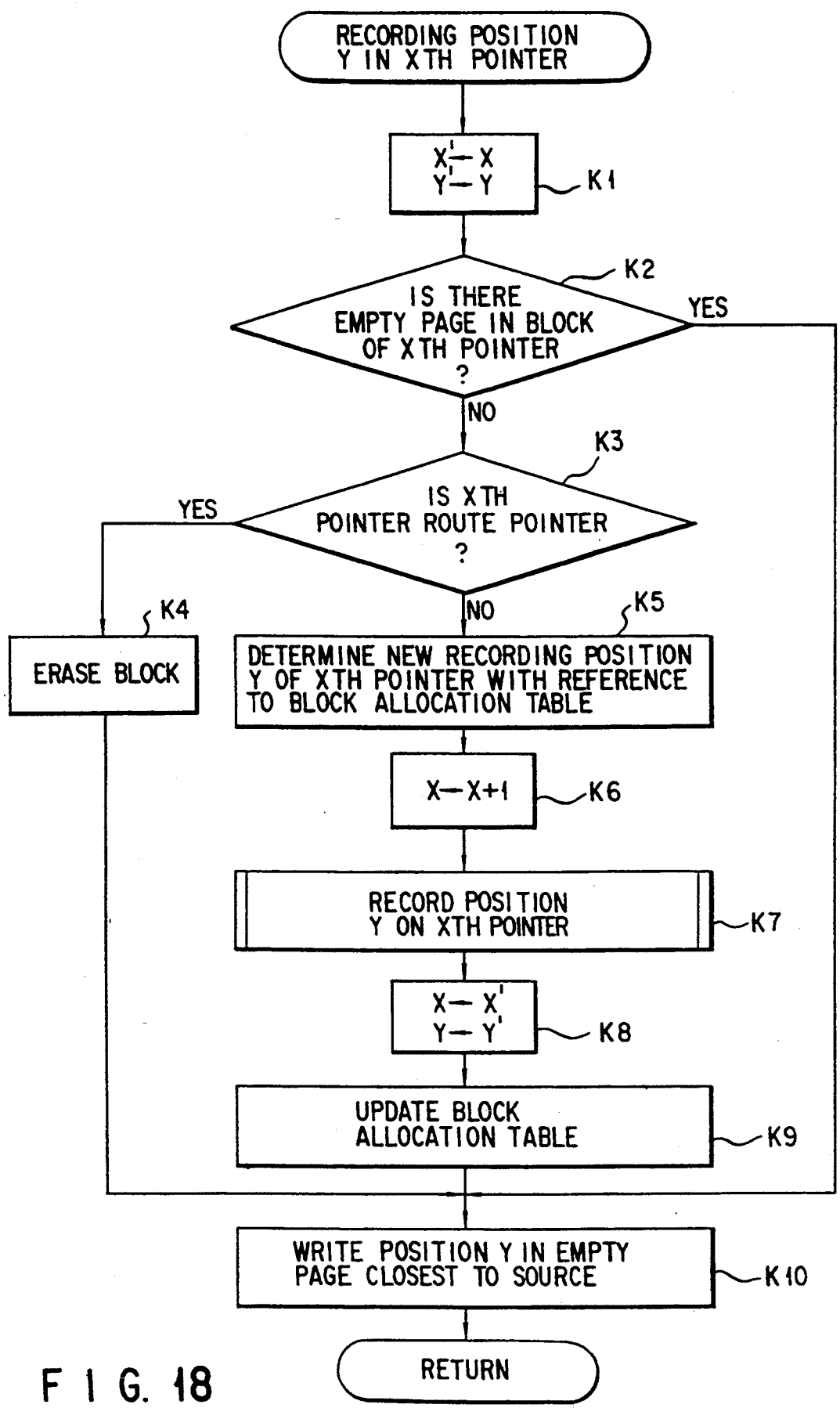
FIG. 18 is a flow chart showing a sequence for setting a block position in a pointer in the second embodiment.

First when block allocation is changed due to write access of a file or the like, the position of a block for writing the changed route management table again is determined with reference to the block allocation table (step J1). This position is set in a pointer, and write access is performed after the allocation table is updated (steps J2 to J5). Steps K1 to K10 in the flow chart of FIG. 18 represent a sequence of setting block positions in hierarchically arranged pointers. This sequence is recursively called to change the setting of the hierarchically arranged pointers.

A method of determining the number n of hierarchical levels of the pointers will be actually described below. The content of route management table is updated every time block allocation is changed by writing a file. The updated table itself is written in another block to prevent write access from being concentrated on a specific block. Since the position of the route management table is changed, the recording position of the first pointer is updated. Since the pointer can be updated 8 times (for 8 pages) in the same block, one write cycle is performed by changing the blocks 8 times caused by writing the file in a block in which the first pointer is stored, and the position of the table is changed by the 9th updating operation of the block. In a block in which the second pointer is stored, as in the block in which the first pointer is stored, it can be estimated that one rewrite operation is performed by writing files 64 times. If the total capacity of a nonvolatile memory device has 20 Mbytes, since the capacity per one block has 4 kbytes, the total number of blocks is 5,120. It is assumed that a maximum rewrite count of an EEPROM is set to be C, when write access is uniformly performed to these blocks, rewriting of $$5120 \times C \text{ blocks}$$

can be performed. When one block of a management table is rewritten for one rewriting operation of a file of one block, since the two blocks are rewritten at the same time, the maximum block allocation count is given as follows:

$$5120 \times C/2 = 2560 \times C$$

One rewriting operation of a fixed block in which the n-th pointer is recorded is performed each time a change in block allocation is performed $8^n$ times. Since this fixed block can be rewritten C times at most, when the change in block allocation is performed $$8^n \times C = 2^{3n} \times C$$

times at most, the maximum rewrite count of the fixed block does not reach its limit before other blocks reach their limits. Therefore, the number n of necessary hierarchical levels is given by:

$$2^{3n} \times C = 2560 \times C$$

$$n = \log_2 2560/3$$

$$\approx 4$$

As described above, according to the second embodiment, a recording position is not fixed in the memory means of a frequently rewritten management table, and pointers representing the position of the management table are hierarchically arranged in a plurality of levels to be recorded. For this reason, the maximum rewrite count of the pointers which are recorded at fixed positions to retrieve the pointers is not limited to the maximum rewrite count of other areas, and write access is not concentrated on a specific area, thereby extending the service life of the memory.

The third embodiment of the present invention will be described below with reference to FIGS. 19 to 23.

FIG. 19 is a block diagram showing an overall arrangement of a nonvolatile semiconductor memory device according to the third embodiment.

In FIG. 19, a NAND-type EEPROM module 1 used as a memory means is constituted by a memory cell array divided into blocks each consisting of a plurality of pages. The EEPROM module 1 is connected to a host system (not shown) through a host interface 2 connected to the module 1 through a data bus. A multiplexer 9 and a data buffer 10 are arranged on the data bus. A data register 3, an address register 4, a count register 5, a command register 6, a status register 7, and an error register 8 are arranged in the host interface 2. In addition, this memory device is constituted by a control logic circuit 11, an error control logic 12, an address generator 13, a CPU 14 functioning as erasing and control means, a work RAM 15, and a control program ROM 16. A series of control programs for data writing or the like are stored in the control program ROM 16.

Figure 20:
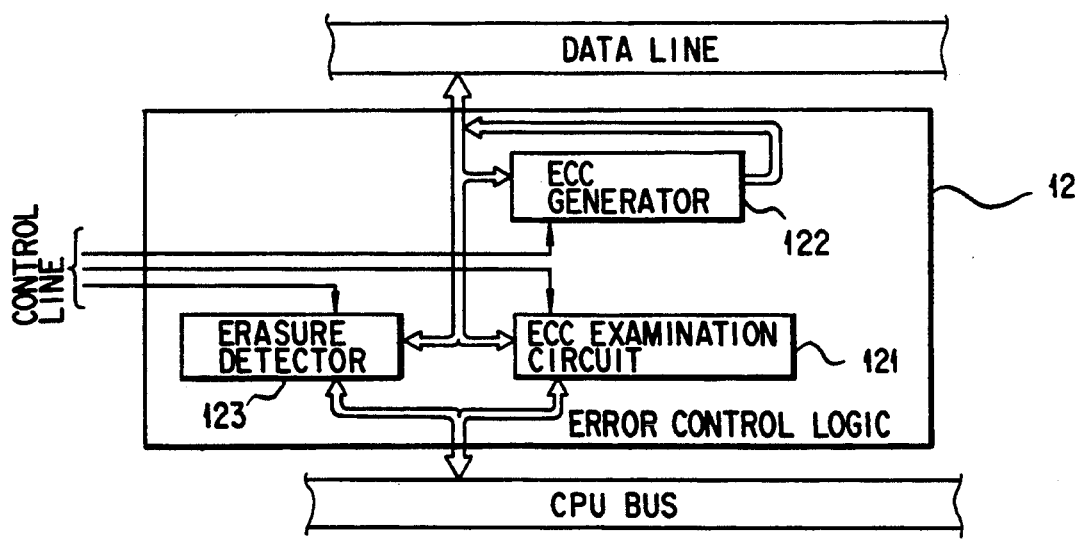
FIG. 20 is a view showing the internal arrangement of an error control logic in FIG. 19.

FIG. 20 is a view showing the internal arrangement of the error control logic 12. The error control logic 12 comprises an ECC examination circuit 121 serving as error detection means, an ECC generator 122 serving as error detection/correction code generation means, and an erasure detector 123 serving as erasure detection means.

The memory device according to the third embodiment uses a table for managing the use states of memory areas as needed in relation to data recorded in the EEPROM module 1 serving as a nonvolatile memory area. Although this management table is recorded in the EEPROM module 1 together with other user data, the management table is automatically loaded in the work RAM 15 when an operation of the memory device is started. The management table is rewritten in the EEPROM module 1 every time the management table is updated or at the end of the use of the device.

An operation of the device of this embodiment will be described below with reference to the flow charts of FIGS. 21 to 23.

In a host system (not shown), an access start address is set in the address register 4 in the host interface 2 in FIG. 19, and the sector length of data to be accessed is set in the count register 5. The host system sets an access instruction such as a read/write access instruction in the command register 6. When the access instruction is written in the command register 6 of the host interface 2, the CPU 14 loads the instruction in the command register 6 and performs a control program and a series of programs for executing commands stored in the ROM 16.

Figure 21:
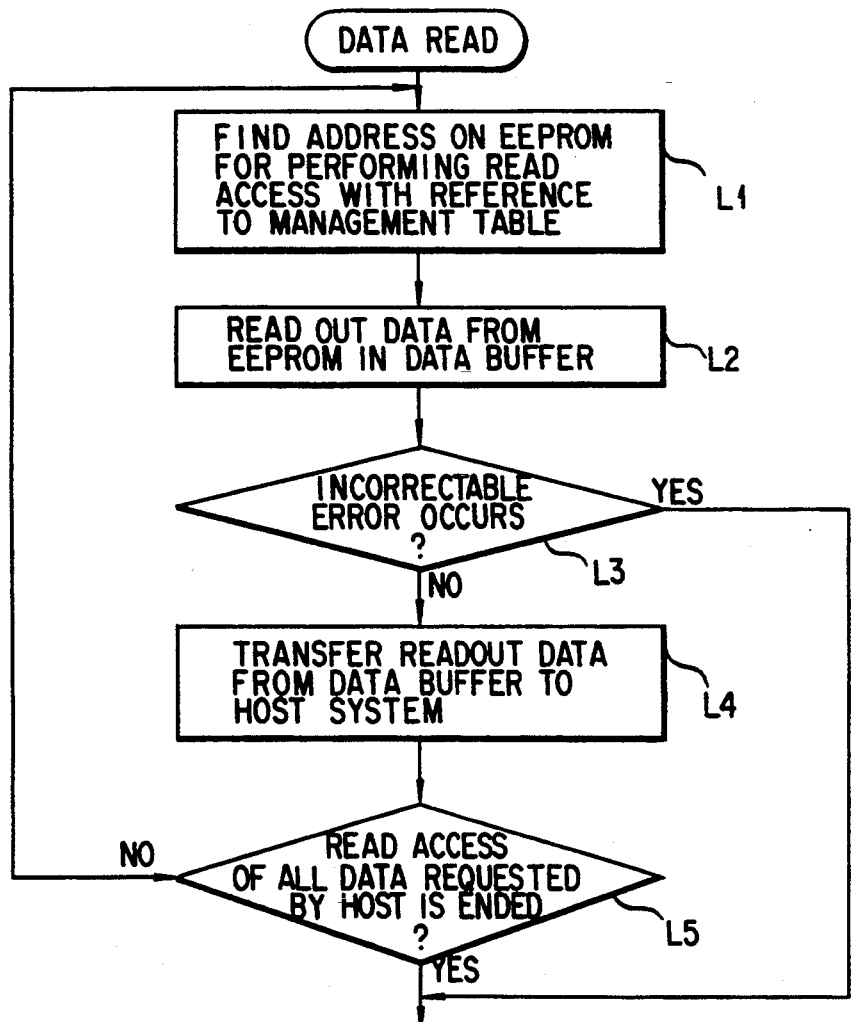
FIG. 21 is a flow chart showing a sequence for reading out data from an EEPROM module in the third embodiment.

FIG. 21 is a flow chart showing a sequence for reading out data from the EEPROM module 1.

The CPU 14 determines the physical address of the EEPROM module 1 subjected to read access on the basis of a start address set in the host interface 2 (step L1). Data is read out from the EEPROM module 1 to the data buffer 10 (step L2). Error processing, transferring of data from the data buffer 10 to the host system, and the like are performed (steps L3 to L5).

Figure 22A:
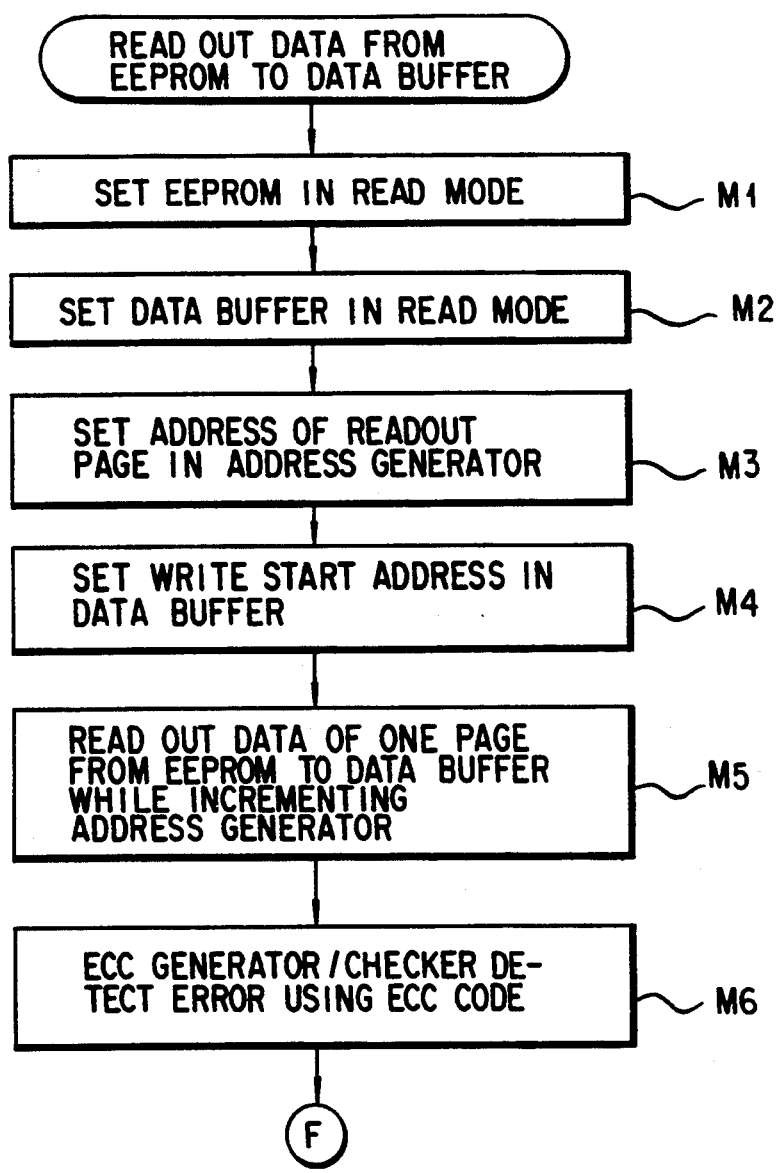
FIGS. 22A and 22B are flow charts showing a sequence for reading out data from the EEPROM module to a data buffer in the third embodiment.
Figure 22B:
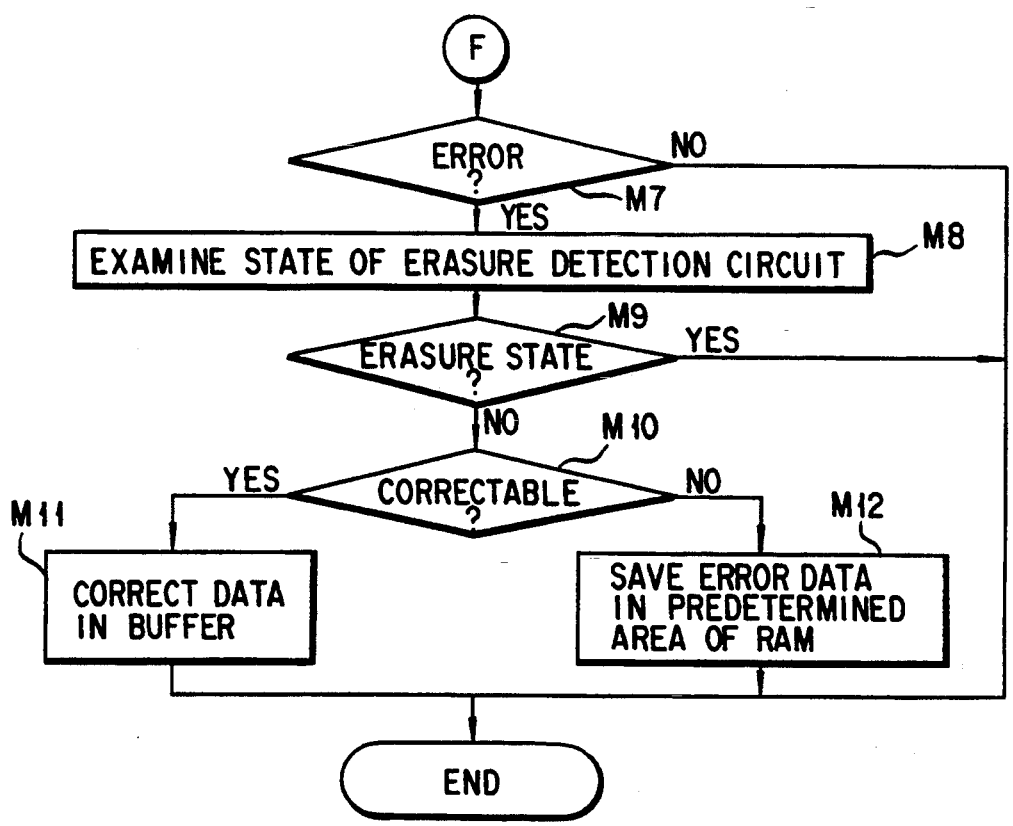

FIGS. 22A and 22B are flow charts showing a sequence for reading out data from the EEPROM module 1 to the data buffer 10. The CPU 14 accesses the EEPROM module 1 through the multiplexer 9 and sets the EEPROM module 1 in a read mode (step M1). The CPU 14 sets the data buffer 10 in a read mode (step M2). The CPU 14 sets the physical address of the EEPROM module 1 subjected to a read operation in the address generator 13 (step M3). The CPU 14 determines an area in which the readout data is to be stored, and the CPU 14 sets the start address of the area as a write address for the data buffer 10 (step M4). Thereafter, the CPU 14 sends a command to the control logic circuit 11 such that the control logic circuit 11 performs a predetermined sequence for reading out data.

The control logic circuit 11 sets the multiplexer 9 such that the readout data from the EEPROM module 1 is supplied to the data buffer 10, and the control logic circuit 11 reads out data of one sector while incrementing the content of the address generator 13 (step M5). The control logic circuit 11 controls the ECC examination circuit 12 such that an error is detected by using the data and an ECC code read out during read access of the data. At the same time, the control logic 11 controls the erasure detector 123 to detect whether the readout data is set in an erasure state. When all the data of one sector and the ECC code are set to be "1", i.e., in an erasure state, the erasure detector 123 sets a code in a register that the CPU 14 can access. The code indicates that the erasure state is detected.

When the data of one sector is read out, the CPU 14 checks the ECC examination circuit 121 to examine the error of the data (step M6). If no error is detected in step M6, the CPU 14 transfers the data from the data buffer to the host system. If an error is detected in step M6, the CPU 14 accesses the erasure detector 123. If an erasure state is detected in the erasure detector 123, the examination result of the ECC examination circuit 121 is regarded as erroneous detection, and the data in the buffer is transferred to the host system. When the ECC examination circuit 121 detects an error, and the erasure detector 123 does not detect the erasure state, if the detected error is correctable, the CPU 14 accesses the data buffer 10, corrects the erroneous data, and transfers the corrected data to the host system.

If an uncorrectable error is detected, the data is not transferred to the host system. The CPU 14 sets a code representing that an error has occurred in the status register 7 of the host interface 2, sets a code representing the content of the error in the error register 8, and informs the host system that the execution of the instruction is abnormally ended, thereby ending the processing (steps M7 to M12).

Figure 23:
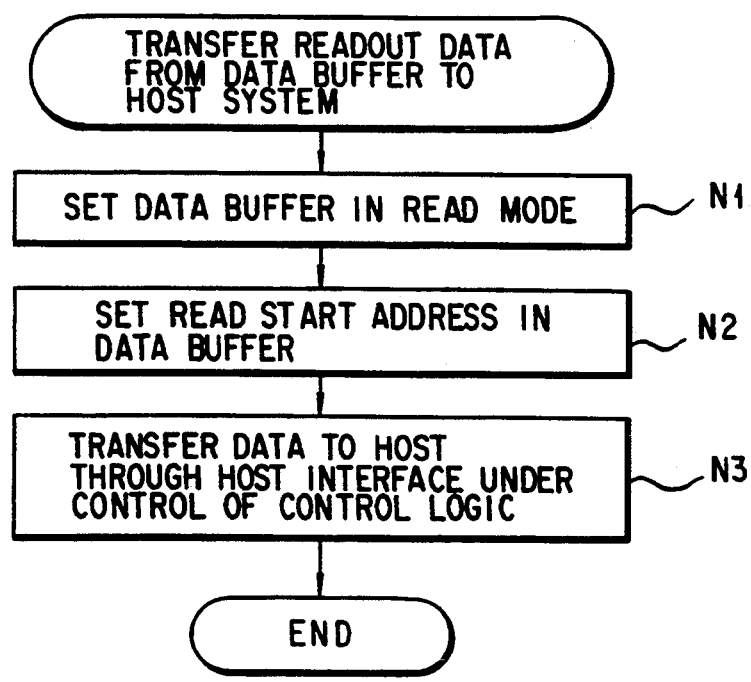
FIG. 23 is a flow chart showing a sequence for transferring data read out from the data buffer of FIG. 21 to a host system.

FIG. 23 is a flow chart showing a sequence of transferring data from the data buffer to the host system.

In the CPU 14, the start address of an area in which readout data is stored is set in the data buffer 10 as a read address from the data buffer 10 (steps N1 and N2). The CPU 14 commands the control logic circuit 11 to transfer data of one sector to the host system 1. The control logic circuit 11 controls the data buffer 10 and the host interface 2 to transfer the data of one sector to the host system (step N3). When this operation is ended, the control logic circuit 11 increments the address register 4 by one sector, decrements the value of the count register 5 by one, and informs the CPU 14 of the end of transfer. Until all data to be transferred are transferred to the host system, the CPU 14 repeats the above control. When all the readout data are transferred, the CPU 14 informs the status register 7 in the host interface that there is no error in the status register 7, thereby ending the processing.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A nonvolatile semiconductor memory device comprising:

memory means having a plurality of storage areas divided in a capacity serving as a management unit;

first managing means for, when data is to be written in said storage areas, circularly arranging said plurality of storage areas such that said plurality of storage areas physically or logically arranged, and managing said storage areas such that said plurality of storage areas are used in accordance with an order of an arrangement of said plurality of storage areas;

second managing means for managing whether data recorded in said plurality of storage areas is changed after a predetermined timing; and control means for, when data is written in said storage area and a predetermined condition is satisfied, selecting a storage area having data which is not changed after a timing when said second managing means is initialized, moving the data in said selected storage area to another storage area, and initializing said second managing means when data in all the storage areas are predicated to be changed.

2. A device according to claim 1, wherein said first and second managing means have means for storing flags representing management states of said first and second managing means, respectively.

3. A device according to claim 1, wherein said control means includes means for determining that the predetermined condition is satisfied at a timing when write access is performed to storage areas of one cycle in the arrangement in which said plurality of storage areas managed by said first managing means are circulated.

4. A device according to claim 1, further comprising third managing means for managing whether significant data is recorded in each of said plurality of storage areas.

5. A device according to claim 4, wherein said third managing means includes means for storing a flag representing a management state of said third managing means.

6. A device according to claim 1, wherein said memory means is one of NAND-type and NOR-type EEPROM.

7. A nonvolatile semiconductor memory device for storing a file including data, comprising:
    memory means for storing a management table which controls a recording position of said file and a plurality of pointers which hierarchically represent a recording position of said management table; and
    control means for controlling only a recording position at which a lowermost pointer of said hierarchically constituted pointers is fixed when the recording position of said management table is floating.

8. A device according to claim 7, wherein said memory means comprises either a NAND-type EEPROM or a NOR-type EEPROM.

9. A nonvolatile semiconductor memory device for storing desired data, comprising:
    memory means having a memory area in which the data and an error correction code corresponding to the data are recorded;
    error detection/correction means for detecting whether an error occurs in the data on the basis of the data and the error correction code which are read out from said memory means;
    erasure detection means for detecting whether said storage area in which the data is recorded is set in an erasure state on the basis of the data read out from said memory means; and
    control means for processing the readout data as data having no error even when an error is detected by said error detection/correction means in the data read out from said memory means, when said erasure detection means simultaneously detects an erasure state.

10. A device according to claim 9, wherein said control means includes means for correcting erroneous data when said error detection/correction means detects an error, said erasure detection means does not detect the erasure state, and the detected error is correctable.

11. A device according to claim 9, wherein said control means includes means for abnormally ending control when said error detection means detects an error, said erasure detection means does not detect an erasure state, and the detected error is uncorrectable.

12. A device according to claim 9, wherein said memory means is one of NAND-type and NOR-type EEPROM.

* * * * *